United States Patent [19]

Soutome

[11] Patent Number: 6,010,921
[45] Date of Patent: Jan. 4, 2000

[54] METHOD OF FABRICATING A FIELD-EFFECT TRANSISTOR UTILIZING AN SOI SUBSTRATE

[75] Inventor: Yoshihiro Soutome, Kashiba, Japan

[73] Assignee: Sharp Kabushiki Kaisha, Osaka, Japan

[21] Appl. No.: 09/062,741

[22] Filed: Apr. 20, 1998

[30] Foreign Application Priority Data

May 23, 1997 [JP] Japan ..................................... 9-132706
Mar. 26, 1998 [JP] Japan ................................... 10-078759

[51] Int. Cl.⁷ .................................................. H01L 21/00
[52] U.S. Cl. ........................................... 438/151; 438/153
[58] Field of Search .................................... 438/149, 151, 438/153, 290

[56] References Cited

U.S. PATENT DOCUMENTS

| | | |
|---|---|---|
| 5,439,836 | 8/1995 | Giffard . |
| 5,567,966 | 10/1996 | Hwang . |
| 5,719,081 | 2/1998 | Racanelli et al. .................. 438/290 |
| 5,736,435 | 4/1998 | Venkatesan et al. ............... 438/151 |
| 5,869,359 | 2/1999 | Prabhakar ......................... 438/149 |

FOREIGN PATENT DOCUMENTS 0 377 084 A1  7/1990  European Pat. Off. .
0 635 880 A1  1/1995  European Pat. Off. .

8-83913  3/1996  Japan .

OTHER PUBLICATIONS

Lee, Jong–Ho et al., "Recessed Channel (RC) SOI NMOSFET's with Self–Aligned . . . ", Proceedings 1996 IEEE International SOI Conference, Oct., 1996, 2 pgs.

*Primary Examiner*—John F. Niebling
*Assistant Examiner*—Michael S. Lebentritt
*Attorney, Agent, or Firm*—Nixon & Vanderhye, P.C.

[57] ABSTRACT

To form a recess defining a channel region in a SOI layer, a LOCOS oxide film is formed on a surface of the SO layer and then removed. Then, side walls of CVD oxide is formed on side surfaces defining an opening of a LOCOS oxide restraining film. Then, a gate oxide film is formed on an exposed surface of the SOI layer inside the opening. Then, CVD polycrystalline silicon is formed on the whole wafer surface, and then etched back to form a gate electrode of polycrystalline silicon inside the opening. At this time, a top surface of the gate electrode is at a level lower than a top surface of the restraining film. Next, the restraining film and the side walls are removed and ion implantation into the SOI layer is performed using the gate electrode as a mask to thereby form a source and a drain region. Then, side walls are formed on side surfaces of the gate electrode, and a silicide film is formed on the gate electrode and the source and drain regions.

10 Claims, 9 Drawing Sheets

METHOD OF FABRICATING A FIELD-EFFECT TRANSISTOR UTILIZING AN SOI SUBSTRATE

BACKGROUND OF THE INVENTION

The present invention generally relates to a semiconductor device fabricating method, and more particularly, to a method of fabricating a field-effect transistor employing a substrate having an SOI (Silicon-on-Insulator) layer, or a silicon layer formed on a supporting substrate with an insulating film interposed therebetween (the substrate including a SOI layer will be referred to as a "SOI substrate" hereinafter), especially a field-effect transistor employing an SOI substrate whose SOI layer has a recessed structure.

LSIs in which field-effect transistors using a bulk silicon substrate as a base are integrated have been developed to have a faster operating speed and/or a lower consumption power with a fine structure. The fineness of the LSIs has been promoted on the basis of a scaling law. However, when the element size is reduced to a level of 0.1 μm or lower, an increased substrate impurity concentration of $10^{18}$ cm$^{-3}$ or more is required for good element isolation.

When the substrate impurity concentration is increased to a value as described above, carrier mobility is reduced significantly. Therefore, an increase in current drive capacity can be hardly expected. This consequently causes a problem that a high performance, which is an advantage provided by the promotion of fineness, cannot be attained. In view of the above, there has been proposed a field-effect transistor formed on an SOI substrate. When forming the transistor on the SOI substrate, the element isolation is achieved not by junction but by a buried oxide film. Therefore, the substrate impurity concentration is suppressed low, so that the carrier mobility can be prevented from being significantly reduced. There is also produced an effect that the junction capacitance is reduced.

The above arrangement consequently enables the achievement of a high performance with promoted fineness. If the SOI layer is sufficiently reduced in thickness by forming a recess in the SOI layer in a portion which becomes a channel, the field-effect transistor formed on the SOI substrate has an improved mobility of carriers because of the fully depletion of the SOI layer. Furthermore, by virtue of the SOI layer formed to a reduced thickness, the field-effect transistor provides an advantage that the short channel effect is remarkably suppressed.

However, in order to achieve a high performance with the SOI structure, it is required that a problem of reducing the parasitic resistance is solved, and without solving this problem, there is no possibility of achieving a high drive current capacity in the SOI transistors.

Furthermore, for the achievement of fineness and a low resistance, it is necessary to use a salicide (self-aligned-silicide) process as a method of making a source region and a drain region have a low resistance. The salicide process is a process which utilizes a phenomenon that metal easily reacts with silicon and hardly reacts with a silicon oxide. The salicide process includes the steps of, after forming a LOCOS (LOCal Oxidation of Silicon) oxide film, a gate electrode and an oxide (or nitride) on side surfaces of the gate electrode by an ordinary process, forming a high-melting-point metal film on the whole surface of the wafer, subjecting it to a heat treatment to thereby form a silicide only in silicon-exposed portions, and removing an unreacted metal film selectively to thereby provide a low-resistance silicide only on the surfaces of the source region and the drain region (and/or a polycrystalline silicon gate electrode). There exists no technique which considers the thickness of the source and drain regions with the intention of obtaining a stable silicide in applying the salicide technique to an SOI transistor having a fully depletion operation.

However, in the case where the whole SOI layer is made to have a thickness required for the fully depletion without using the recessed structure, i.e., in the case of an SOI layer of which the thickness in the source and drain regions is as thin as that of the channel portion, it is difficult to obtain a uniform, stable crystalline phase C54 of a silicide of a high-melting-point metal such as titanium, because of the occurrence of a high resistance due to agglomeration.

When the high-melting-point metal film is thin, a phase shift from a quasi-stable high-resistance phase C49 of the high-melting-point metal silicide to the low-resistance phase C54 is insufficient. In this case, a temperature nonuniformity in the substrate surface in an annealing process and/or a thickness nonuniformity due to sputtering of a high-melting-point metal such as Ti prior to the annealing process easily affect the resistance in the substrate surface, consequently making it a nonuniform one.

Furthermore, when the silicide is thin, a contact may disadvantageously penetrate the silicide in the contact processing stage, causing a high contact resistance.

For these reasons, when the salicide technique is adopted, it is difficult to fabricate a field-effect transistor on an SOI substrate without using the recessed structure.

Next, methods of fabricating a field-effect transistor formed on an SOI layer of the recessed structure utilizing techniques disclosed in Japanese Patent Laid-Open Publication No. HEI 8-83913 will be described with reference to FIGS. 5A, 5B, 5C and 5D and FIGS. 6A, 6B, 6C and 6D. Note that the structure described in the above document is a structure in which the SOI layer in source and drain regions is made sufficiently thick to reduce the parasitic resistance and the SOI layer in a channel portion is made sufficiently thin to achieve a fully depletion.

First of all, a first fabricating method will be described with reference to FIGS. 5A through 5D.

Figure 5A:
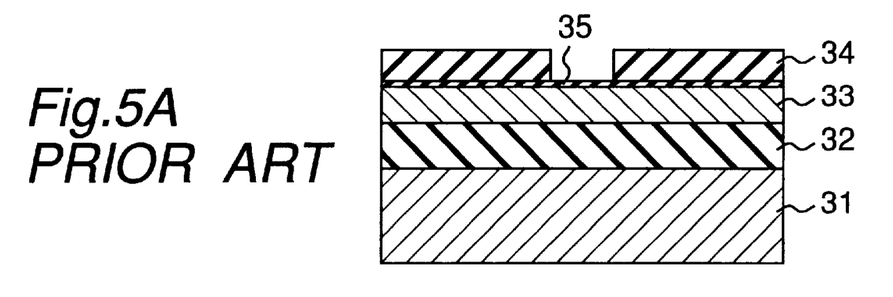
FIGS. 5A, 5B, 5C and 5D illustrate steps for forming a field-effect transistor on an SOI layer having a recessed structure according to the first prior art.

In the first fabricating method, first, a silicon oxide film 35 is formed on an SOI substrate which is comprised of a silicon substrate 31, a buried silicon oxide film 32 and an SOI layer 33. Next, by means of an LPCVD (Low Pressure Chemical Vapor Deposition) method, a silicon nitride film 34 is deposited on the silicon oxide film 35. Then, resist is patterned to be opened at a portion corresponding to the channel region, and the silicon nitride film 34 there is removed, thus providing a structure as shown in FIG. 5A.

Figure 5B:
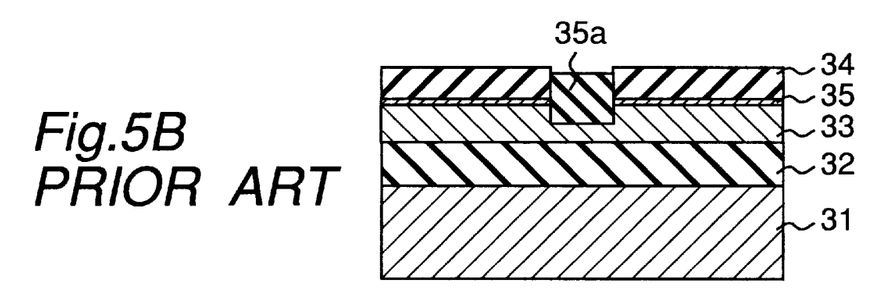
Figure 5C:
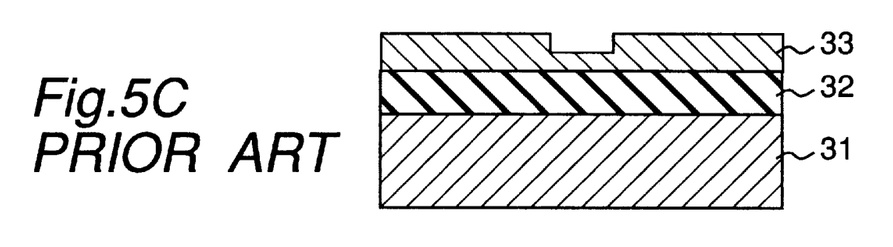

Next, by performing oxidation, the SOI layer 33 in a position corresponding to the channel region only is made thin. This oxidation can be controlled with an accuracy of 10 Å. Therefore, the oxidation condition can be properly optimized so that the thickness of a finally obtained channel region has a desired value. Thus, a structure as shown in FIG. 5B is obtained. Reference numeral 35a denotes a LOCOS oxide film. Then, the silicon nitride film 34, the silicon oxide film 35 and the LOCOS oxide film 35a are removed, thereby obtaining a structure having a cross-sectional view as shown in FIG. 5C.

Figure 5D:
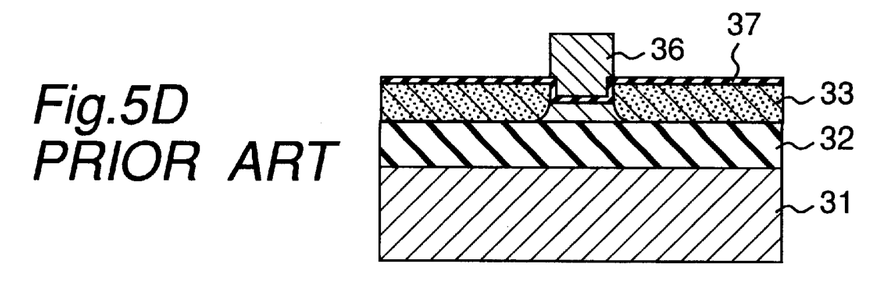

Finally, gate oxidation is performed according to a common field-effect transistor fabricating process, thereby forming a gate oxide film 37. Next, processing of a gate electrode 36 and ion implantation into the source and drain regions are performed, thereby achieving a structure as shown in FIG. 5D.

A second fabricating method will be described next with reference to FIGS. 6A through 6D.

Figure 6A:
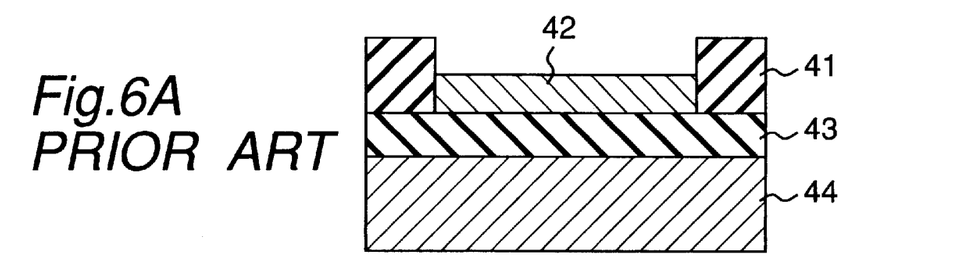
FIGS. 6A, 6B, 6C and 6D illustrate steps for forming a field-effect transistor on an SOI layer having a recessed structure according to the second prior art.
Figure 6B:
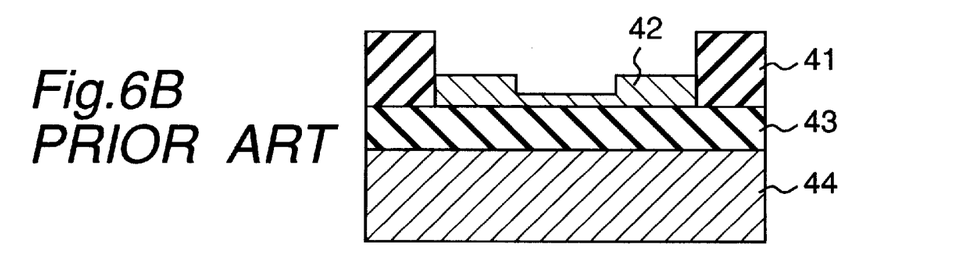

First, an element isolation LOCOS oxide film 41 is formed on an SOI substrate consisting of a silicon substrate 44, a buried silicon oxide film 43 and an SOI layer 42 according to a common field-effect transistor forming process, thereby obtaining an element isolation structure having a cross section as shown in FIG. 6A. Next, a resist formed on the SOI layer 42 is patterned to be opened at a portion which corresponds to a channel region so that the SOI layer 42 is partially etched away. At this time, the etching conditions are optimized such that the thickness of the channel region finally has a desired value. In this way, the channel region is formed between a source region and a drain region.

Figure 6C:
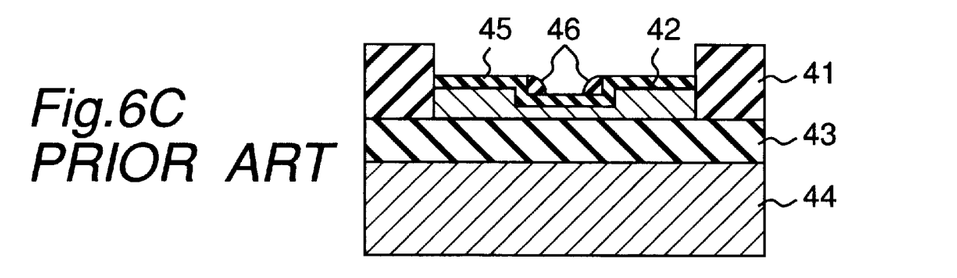
Figure 6D:
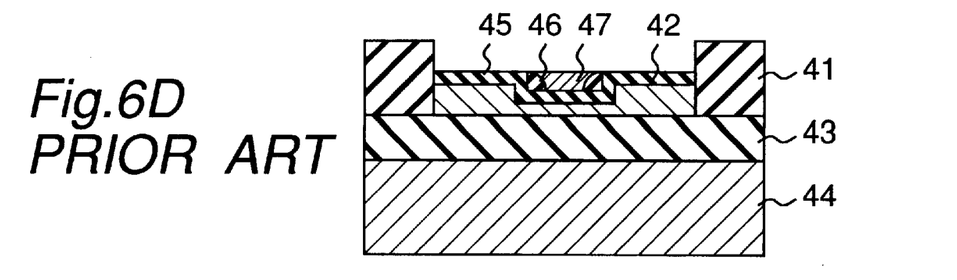

Next, the patterning resist is removed, thereby obtaining a structure having a cross-section as shown in FIG. 6B. Subsequently, a surface of the SOI layer 42 constituting the channel region, source region and drain region are oxidized to form a silicon oxide film 45, and then a silicon nitride film 46 is deposited on it. Further, the silicon nitride film 46 is selectively removed by anisotropic etching, so that the silicon nitride film 46 is left only on the side surfaces of raised portions at the boundary between the channel region and the source region and at the boundary between the channel region and the drain region, respectively. Through the above steps, a structure having a cross-section as shown in FIG. 6C is obtained. Finally, a gate electrode material is deposited on the whole wafer surface to form a buried gate electrode 47 by a etch-back process. Finally, ion implantation into the source region and the drain region is performed. Thus, a structure as shown in FIG. 6D is completed.

A further technique has also been proposed, which is shown in FIGS. 7A, 7B, 7C and 7D.

Figure 7A:
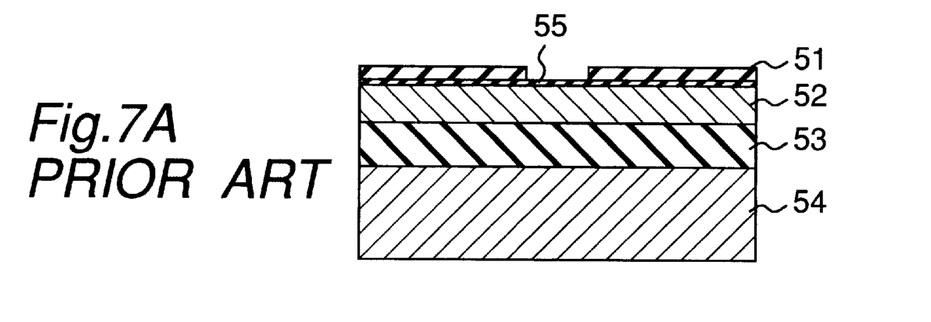
FIGS. 7A, 7B, 7C and 7D illustrate steps for forming a field-effect transistor on an SOI layer having a recessed structure according to the third prior art.
Figure 7B:
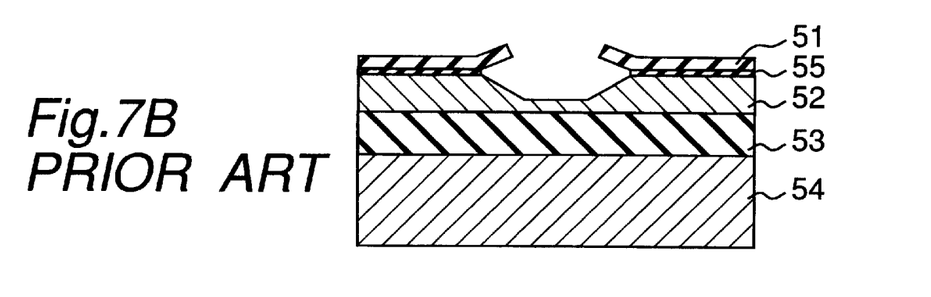
Figure 7C:
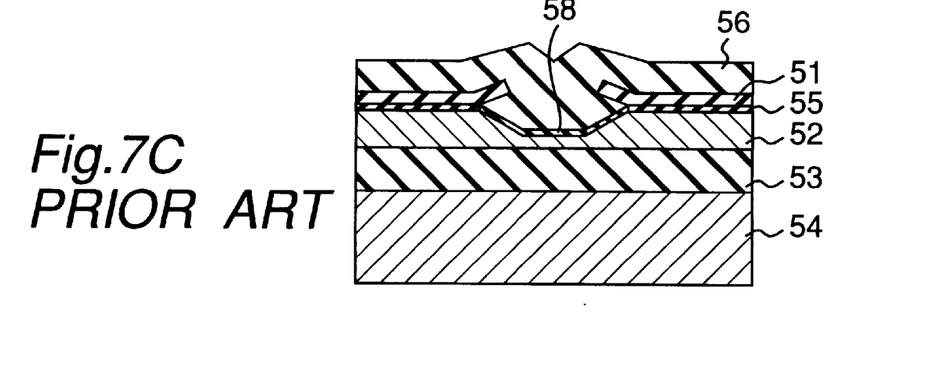
Figure 7D:
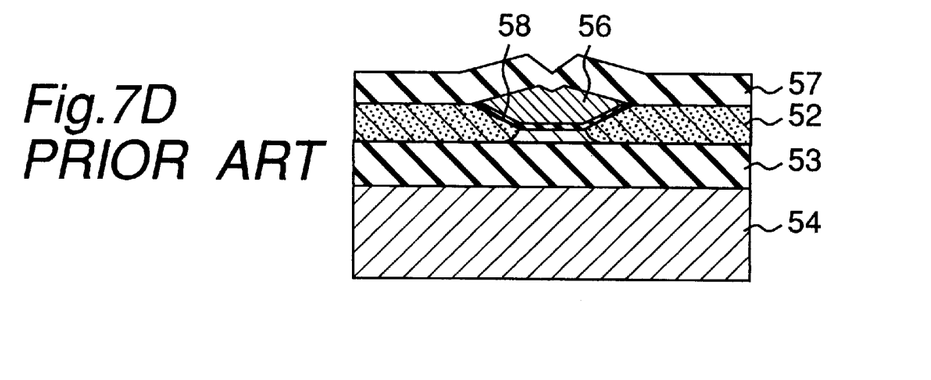

First, as shown in FIGS. 7A and 7B, a channel portion is subjected to the LOCOS process so that an SOI film 52 is recessed. It is to be noted that the cross-sectional structure shown in FIG. 7A is identical to that of FIG. 5A, and in FIG. 7A, reference numeral 51 denotes a silicon nitride film, reference numeral 53 denotes a buried silicon oxide film, reference numeral 54 denotes a silicon Hsubstrate, and reference numeral 55 denotes a silicon oxide film. Subsequently, as shown in FIG. 7C, a gate oxide film 58 is formed without removing the silicon nitride film 51 which serves as a film for restraining or pressing the LOCOS oxide film, and then a CVD polycrystalline silicon film 56 is formed on the whole wafer surface. Subsequently, the polycrystalline silicon film 56 is etched back to the surface of the silicon nitride film 51. Then a source region and a drain region are formed according to a common process. In this way, an SOI transistor having a recessed structure is completed as shown in FIG. 7D, where reference numeral 57 denotes a silicon oxide film.

In the meanwhile, in order to cope with the fineness of LSIs which will be promoted more and more, the following requirements or conditions should be met. It is to be noted that the term "LOCOS ends" appearing below denotes SOI layer portions defined by LOCOS oxide end portions including no flat LOCOS bottom, the LOCOS oxide end portions including the whole bird's beak.

In the first place, in forming a transistor having a recessed structure by a currently available technique, to reduce damage of the SOI layer surface at the channel forming portion, it is necessary to use not the dry etching process but the LOCOS technique.

In the second place, when the LOCOS technique is used, it is required that the gate electrode is formed inside of the LOCOS ends, and more preferably, on a flat portion, and does not overlap the LOCOS ends. The reasons for this are that the LOCOS ends tend to have a crystalline defect due to a stress generated in the LOCOS forming stage so that a leak current attributed to the crystalline defect occurs; that extension of the bird's beak is difficult to control due to the attributes of the process; and that a stable channel implantation is difficult when the channel includes a raised portion of the LOCOS end.

Third, in order to form the source/drain regions by self aligned implantation, it is required that side surfaces of the gate electrode are perpendicular to the substrate surface.

Fourth, the technique using two masks for the formation of the recess and the formation of the gate electrode requires a margin accordingly. Therefore, such a technique is not appropriate for the promotion of fineness. This technique also may cause a variation of characteristics due to a deviation of the gate electrode. Therefore, to promote the fineness and stabilize the characteristics, the recess and the gate electrode are required to be formed by a self-alignment technique.

Fifth, when employing the salicide technique, in order to prevent a short-circuit due to the bridging of the source/drain regions and the gate by the silicide, it is required that the gate electrode is provided with side walls of a CVD insulation film. Therefore, the side surfaces of the gate electrode are required to have a certain perpendicularity to the substrate surface and a certain height, similarly to the case of the self aligned implantation into the source/drain regions.

Studying the above-mentioned prior arts taking the above in consideration, the prior art shown in FIGS. 5A through 5D is not of the self-alignment type although it uses the LOCOS technique, meaning that it does not meet the aforementioned fourth requirement. Furthermore, a channel region exists at the LOCOS ends, so that the second requirement is not met. Therefore, this prior art has the problem of a leak current and deterioration of the characteristics of the field-effect transistor.

Regarding the prior art shown in FIGS. 6A through 6D, the recessed structure is formed not by the LOCOS technique but by directly etching the SOI layer by the dry etching technique, meaning that the first requirement is not met. Furthermore, the surface of the gate electrode and the surface of the source/drain regions are located at approximately identical levels, i.e., the gate electrode is buried in the recess. Therefore, if the salicide technique is employed, there is a strong possibility that bridging occurs, resulting in that the gate and the source and drain regions are short-circuited.

With respect to the prior art shown in FIGS. 7A through 7D, the above second, third and fifth requirements are not met. That is, the gate electrode overlaps the LOCOS ends and the gate electrode side surfaces are not perpendicular. Therefore, the implantation into the source and drain regions and the implantation into the channel region are difficult to control. Furthermore, when the salicide technique is employed, it is difficult to form the side walls on the gate electrode side surfaces since the gate electrode side surfaces are not perpendicular to the substrate surface.

SUMMARY OF THE INVENTION

An object of the present invention is therefore to provide a method which meets the aforementioned requirements and thus is capable of fabricating a highly reliable field-effect transistor which has a compatibility between a fully depletion operation and a reduction of the parasitic resistance in the source/drain regions and offers a stable operation.

In order to accomplish the above object, a method of fabricating a field-effect transistor according to an aspect of the present invention includes:

forming a LOCOS oxidation restraining film on an SOI layer which is formed on a substrate of a wafer with interposition of a first insulating film between the substrate and the SOI layer;

forming an opening in the restraining film in a region corresponding to a channel region;

thermally oxidizing the SOI layer using the restraining film having the opening as a mask to form a LOCOS oxide film, and then removing the LOCOS oxide film to thereby provide the SOI layer with a recess in a region which will be the channel region;

depositing a second insulating film on an entire surface of the wafer and then anisotropically etching the second insulating film to thereby form first side walls on side surfaces defining the opening of the restraining film;

exposing a top surface of the SOI layer inside the opening to form a gate insulating film on that top surface, and then forming a polycrystalline silicon film serving as a gate electrode inside the opening, wherein a top surface of the polycrystalline silicon film is at a level not higher than that of a top surface of the restraining film; and removing the restraining film and the first side walls, and then, implanting ions into the SOI layer using the gate electrode as a mask to thereby form a source region and a drain region.

The exposed top surface of the SOI layer on which the gate insulating film is formed is a flat surface.

In an embodiment, the method further includes:

depositing a third insulating film on an entire surface of the wafer, and anisotropically etching the third insulating film to form second side walls on side surfaces of the gate electrode; and forming a high-melting-point metal on an entire surface of the wafer, and thermally treating the high-melting-point metal so as to form a high-melting-point metal silicide film on the gate electrode and the source and drain regions.

According to the present invention, there is also provided a method of fabricating a field-effect transistor, comprising:

forming a LOCOS oxide restraining film on an SOI layer which is formed on a substrate of a wafer with interposition of a first insulating film between the substrate and the SOI layer;

forming an opening in the restraining film in a region corresponding to a channel region;

thermally oxidizing the SOI layer using the restraining film having the opening as a mask to form a LOCOS oxide film, and then removing the LOCOS oxide film to thereby provide the SOI layer with a recess defining the channel region;

depositing a second insulating film on an entire surface of the wafer and then anisotropically etching the second insulating film to thereby form first side walls on side surfaces defining the opening of the restraining film;

exposing a top surface of the SOI layer inside the opening to form a gate insulating film on that top surface, and then forming a polycrystalline silicon film serving as a gate electrode inside the opening, wherein a top surface of the polycrystalline silicon film is at a level not higher than that of a top surface of the restraining film;

removing the restraining film and the first side walls, and then, implanting ions into the SOI layer using the gate electrode as a mask to thereby form a low-concentration source region and a low-concentration drain region;

depositing a third insulating film on an entire surface of the wafer, and anisotropically etching the third insulating film to form second side walls on side surfaces of the gate electrode; and implanting ions into the SOI layer using the gate electrode and the second side walls as a mask to thereby form a high-concentration source region and a high-concentration drain region.

In an embodiment, the method further includes forming a high-melting-point metal on an entire surface of the wafer, and thermally treating the high-melting-point metal so as to form a high-melting-point metal silicide film on the gate electrode and the high-concentration source and drain regions.

In any of the above methods, in order to reduce stress in the SOI layer at LOCOS ends, it is preferable that the thermal oxidization of the SOI layer to form the LOCOS oxide film and removal of the LOCOS oxide film is performed in a plurality of stages.

In an embodiment, the LOCOS oxidation restraining film consists of a silicon oxide film and a silicon nitride film which are formed in that order.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention will be described in detail below based on an embodiment thereof.

Figure 1A:
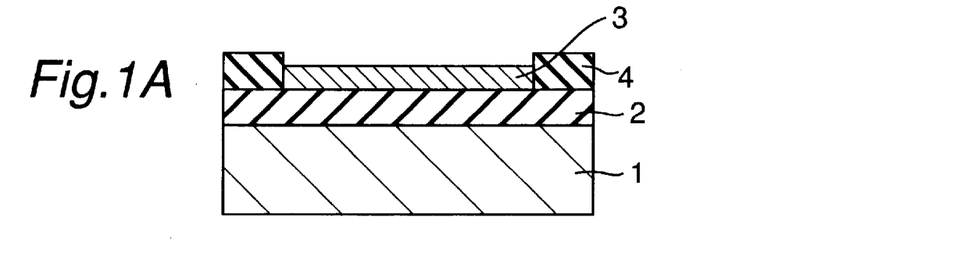
FIGS. 1A, 1B, 1C, 1D, 1E, 1F, 1G and 1H illustrate steps for fabricating a field-effect transistor according to a first embodiment of the present invention.
Figure 1B:
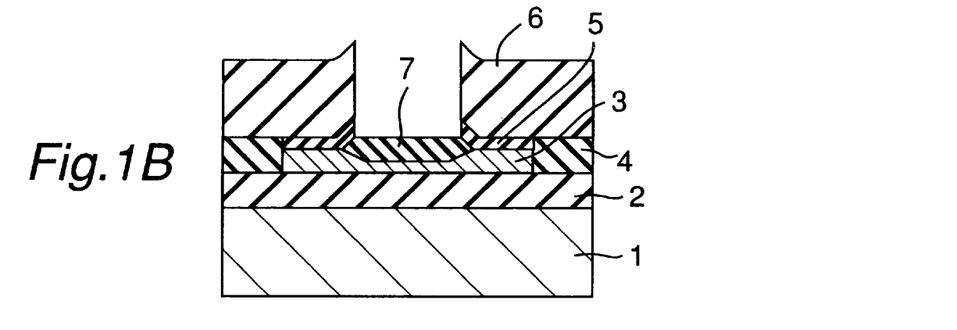
Figure 1C:
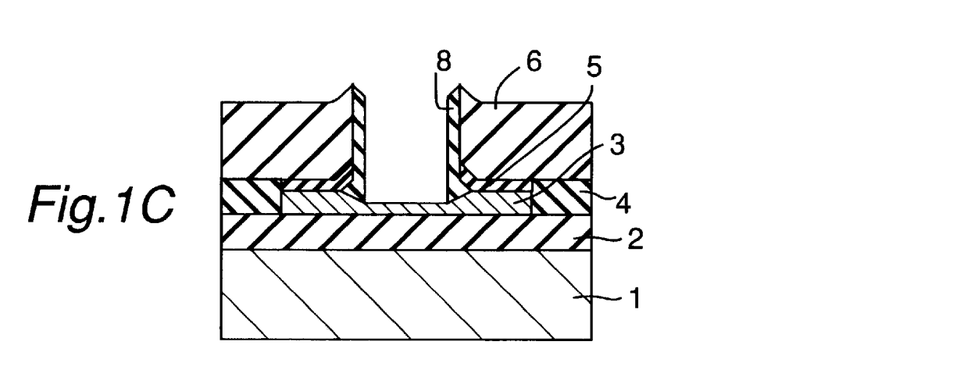
Figure 1D:
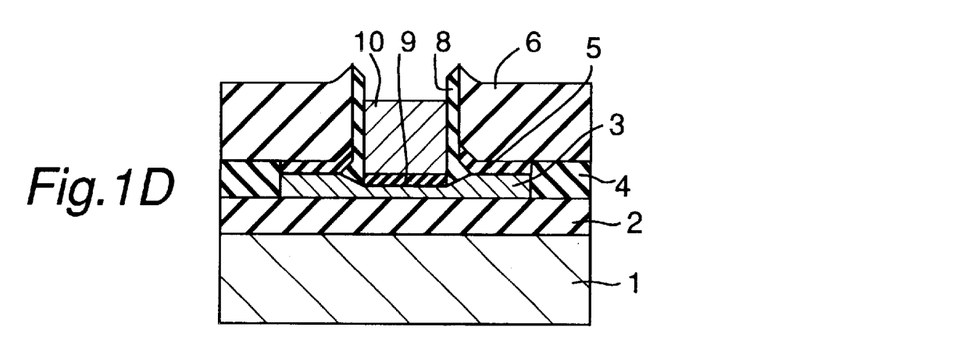
Figure 1E:
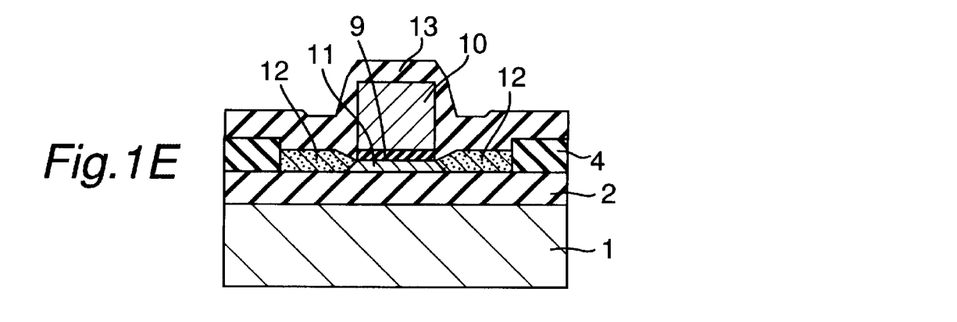
Figure 1F:
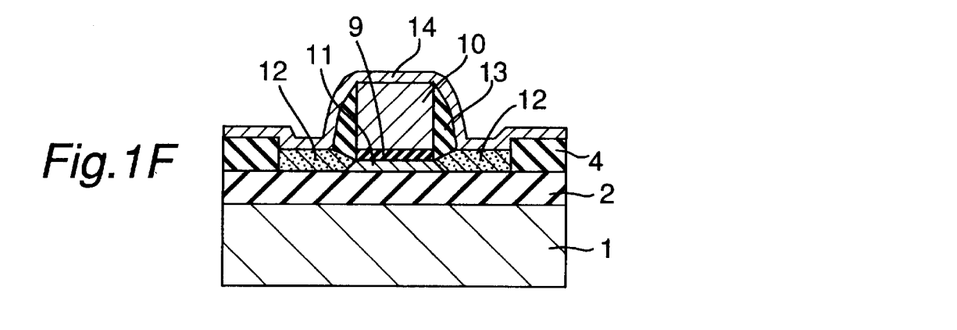
Figure 1G:
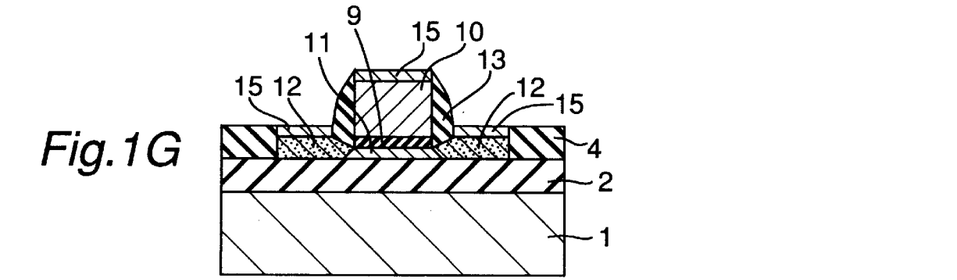
Figure 1H:
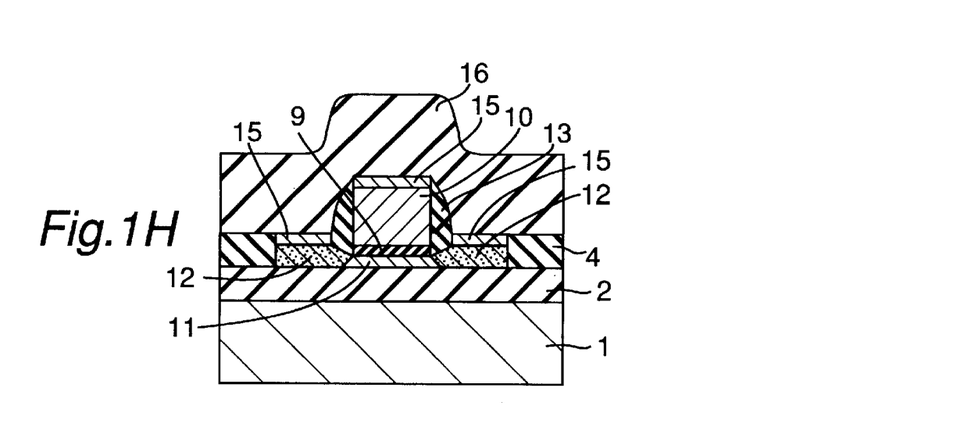
Figure 2:
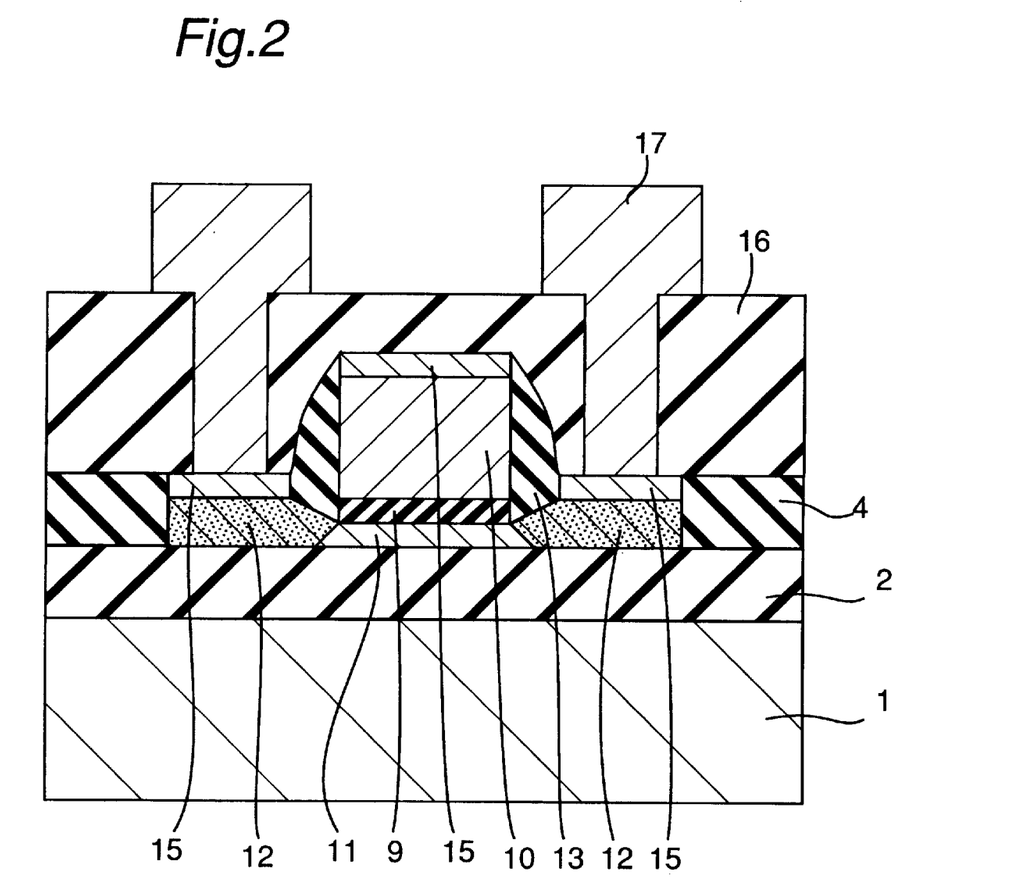
FIG. 2 is a cross-sectional view of a structure of the field-effect transistor fabricated through the steps shown in FIGS. 1A through 1H.

FIGS. 1A through 1H are illustrations showing a process flow for fabricating a semiconductor device according to an embodiment of the present invention. FIG. 2 is a cross-sectional view of a field-effect transistor obtained through this fabricating process. The fabricating process according to the present invention will be described below with reference to these figures.

First, an SOI substrate (e.g., SIMOX: Separation by Implanted Oxygen) is prepared, wherein an SOI layer 3 of a thickness of about 100 nm is formed on a substrate 1 with a buried oxide film 2 as a first insulating film interposed therebetween. The thickness of the SOI layer 3 can be controlled by controlling an oxidation and wet process. Alternatively, the depth position of oxygen injection may be controlled so that the SOI layer 3 has a thickness of 100 nm. (FIG. 1A)

Subsequently, after forming an element isolation film 4, a restraining or pressing film necessary for the LOCOS oxidation of a recess forming portion is formed. That is, a top surface of the SOI layer 3 is oxidized to a depth of about 10 nm to thereby form a silicon oxide film 5, and subsequently a silicon nitride film 6 is formed to a thickness of about 300 nm. It is to be noted that the silicon nitride film 6 has factors of controlling the shape of the LOCOS oxide film and concurrently controlling the gate electrode shape. The thicker the silicon nitride film 6 is, the more perpendicular side surfaces of the gate electrode become with respect to the substrate surface. Subsequently, patterning is performed by photolithography and etching involved in a common LOCOS process, thereby forming an opening having a width of 0.7 μm through the silicon oxide film 5 and the silicon nitride film 6. Subsequently, to reduce the thickness of the SOI layer 3 at the channel portion to about 50 nm, the exposed surface of the SOI layer 3 is thermally oxidized using the silicon oxide film 5 and the silicon nitride film 6 having the opening as a mask to thereby form a LOCOS oxide film 7 of a thickness of about 100 nm. (FIG. 1B)

Next, the LOCOS oxide film 7 is entirely removed by dilute hydrofluoric acid. If the LOCOS oxidation/removal process is performed in several stages, influence of a stress from the restraining film upon the LOCOS ends is reduced. Therefore, the flat portion of the gate electrode forming region can be made wide, and a stress toward the inside of the SOI layer can be reduced at the end portions of the LOCOS oxide film 7. Subsequently, a CVD oxide film which serves as a second insulating film is formed to a thickness of about 100 nm, and then anisotropically etched to form side walls 8 of the CVD oxide film on the side surfaces of the restraining film 5, 6. In this stage, the anisotropic etching is ended halfway to leave the CVD oxide film on the SOI layer 3 by about 10 nm so that no plasma damage occurs on the surface of the SOI layer 3. Subsequently, for the purpose of controlling a threshold value, boron ions are implanted into the SOI layer 3 with an acceleration energy of 40 keV and a dose of $4 \times 10^{12}$ cm$^{-2}$. Next, the CVD oxide film left on the surface of the channel portion is removed and cleaned by wet etching, thereby exposing the surface of the SOI layer 3 inside the opening. It is to be noted that this wet etching is performed with an over-etching of about 50% (about 15 nm in terms of the oxide film thickness) so that the CVD oxide film forming the side walls does not disappear. (FIG. 1C)

Next, a gate oxide film 9 which serves as a gate insulating film is formed to a thickness of about 10 nm, and subsequently a CVD polycrystalline silicon is formed to a thickness of about 500 nm on the whole surface of the wafer. The polycrystalline silicon is etched back by dry etching or CMP (Chemical Mechanical Polishing) process to a thickness of about 200 nm so that a gate electrode 10 formed of this polycrystalline silicon has a generally rectangular cross-section, in other words, the gate electrode has side surfaces which are straight and substantially perpendicular to the substrate surface. (FIG. 1D)

Next, the silicon nitride film 6 and the oxide film 5 for restraining the LOCOS oxide film 7, and the side wall oxide film 8 are removed by phosphoric acid and hydrofluoric acid, respectively. As a result, the gate electrode 10 having a line width of about 0.5 μm is completed. Subsequently, after forming a CVD oxide film to a thickness of about 10 nm on the surface, phosphorus ions are implanted into the source/drain regions 12 and the gate electrode 10 with an implantation energy of 50 keV and a dose of $3 \times 10^{15}$ cm$^{-2}$, and then diffused at a temperature of 900° C. for 20 minutes. At the time of ion implantation into the source/drain regions 12, the gate electrode 10 serves as a mask. Subsequently, a CVD oxide film 13 which serves as a third insulating film is formed to a thickness of about 100 nm on the whole wafer surface. (FIG. 1E) In FIG. 1E, reference numeral 11 denotes a channel region.

Next, the oxide film 13 is etched back by anisotropic etching to thereby form side walls 13 on the side surfaces of the gate electrode 10, with some of the oxide film remaining on the surface of the source/drain regions 12. Then, the oxide film remaining on the surface of the source/drain regions 12 is removed by wet etching. Subsequently, a Ti film 14 which is a high-melting-point metal film is formed to a thickness of 60 nm by sputtering. (FIG. 1F)

Next, the Ti film 14 is subjected to a heat treatment at a temperature of 600° C. for 10 seconds to form a silicide film 15 of a high-resistance phase of C49 on the gate electrode 10 and the source/drain regions 12. Next, the unreacted Ti film 14 is removed by sulfuric acid and hydrogen peroxide solution, and the silicide film 15 is further subjected to a heat treatment at a temperature of 800° C. for 60 seconds, whereby a low-resistance phase of C54 is obtained. After the above process, a structure having a cross section shown in FIG. 1G is obtained. Subsequently, an interlayer insulating film 16 comprised of CVD oxide is formed to a thickness of 800 nm (FIG. 1H), and then flattened by the CMP process. Then, through a typical contact process and wiring process, a field-effect transistor as shown in FIG. 2 is obtained. In FIG. 2, reference numeral 17 denotes a wire.

The following describes steps of fabricating a semiconductor device according to a second embodiment with reference to FIGS. 3A–3H and FIG. 4, the semiconductor device having an LDD (Lightly-Doped Drain) structure FET wherein a source region and a drain region each include a low concentration region and a high concentration region.

In FIGS. 3A–3H and 4, parts similar to or same as the parts shown in FIGS. 1A–1H and 2 are denoted by the same reference numeral as those in FIGS. 1A–1H and 2. Also, the steps, shown in FIGS. 3A–3E, up to completing an gate electrode 10 having a line width of about 0.5 μm are the same as those shown in FIGS. 1A–1E. Therefore, the detailed description of these steps is omitted here.

Figure 3A:
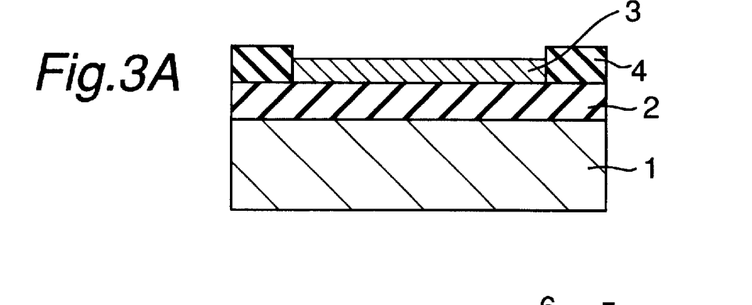
FIGS. 3A, 3B, 3C, 3D, 3E, 3F, 3G and 3H illustrate steps for fabricating a field-effect transistor according to a second embodiment of the present invention.
Figure 3B:
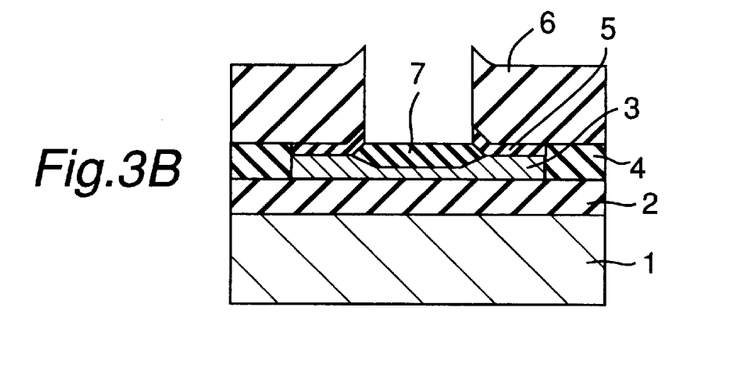
Figure 3C:
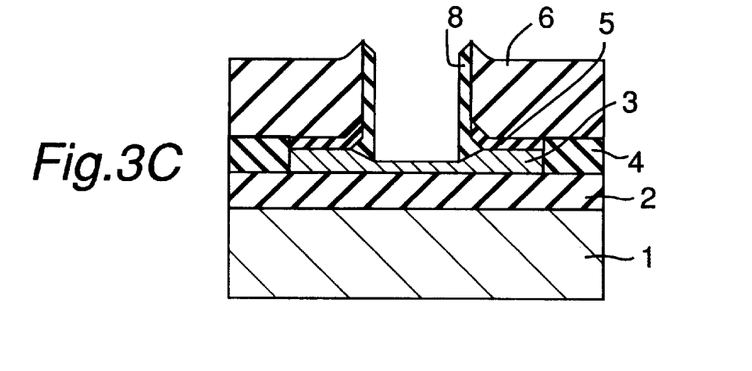
Figure 3D:
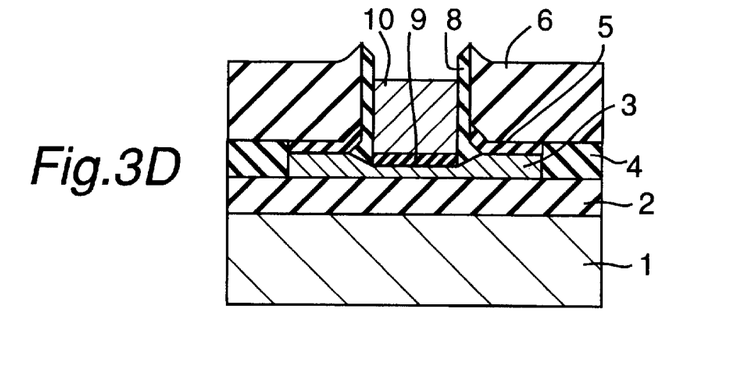
Figure 3E:
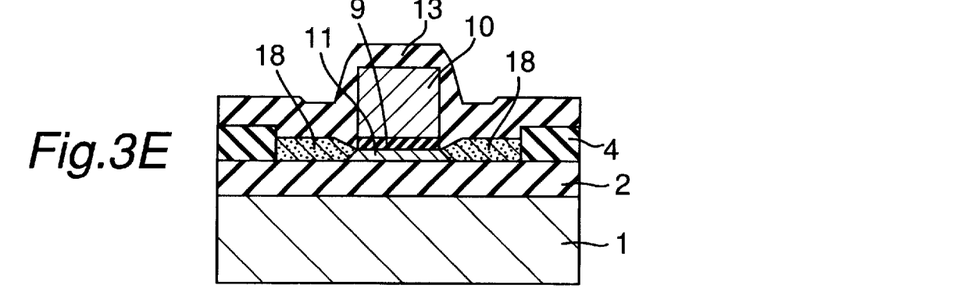

Referring now to FIG. 3E, after completing the gate electrode 10, a CVD oxide film is formed to a thickness of about 10 nm on the surface, and then phosphorus ions are implanted using the gate electrode 10 as a mask and with an implantation energy of 30 keV and a dose of $4 \times 10^{12}$ cm$^{-2}$ to form low-concentration source/drain regions 18. Subsequently, a CVD oxide film 13 is formed to a thickness of about 100 nm on the whole wafer surface.

Figure 3F:
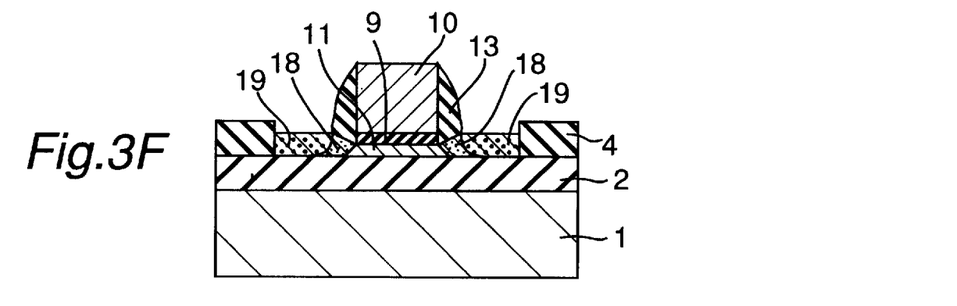

Next, the oxide film 13 is etched back by anisotropic etching to thereby form side walls 13 on the side surfaces of the gate electrode 10, with some of the oxide film remaining on the surface of the low-concentration source/drain regions 18. Then, to form high-concentration source/drain regions 19, phosphorus ions are implanted using the gate electrode 10 and the side walls 13 as a mask and with an implantation energy of 50 keV and a dose of $3\times10^{15}$ cm$^{-2}$, and then diffused at a temperature of 900° C. for 20 minutes. (FIG. 3F)

Figure 3G:
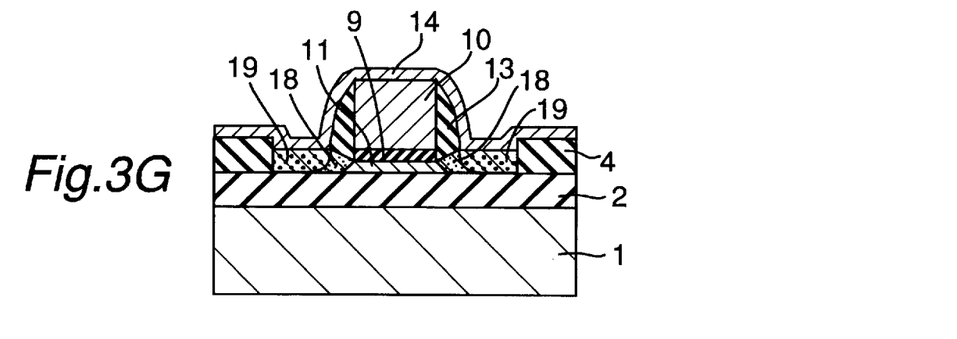
Figure 3H:
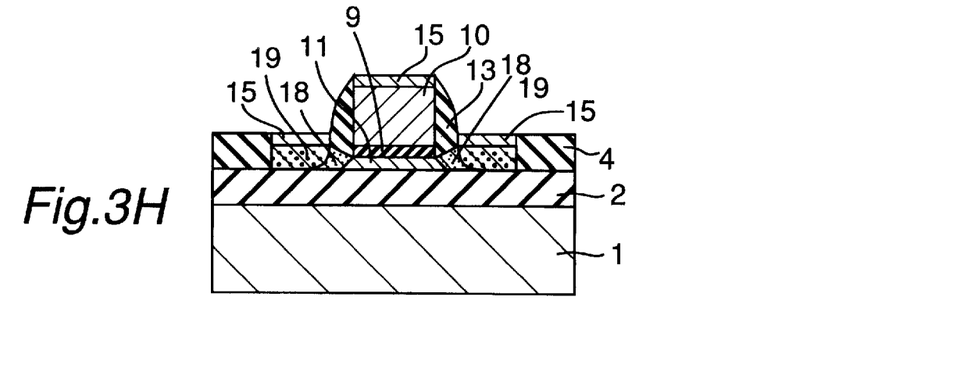
Figure 4:
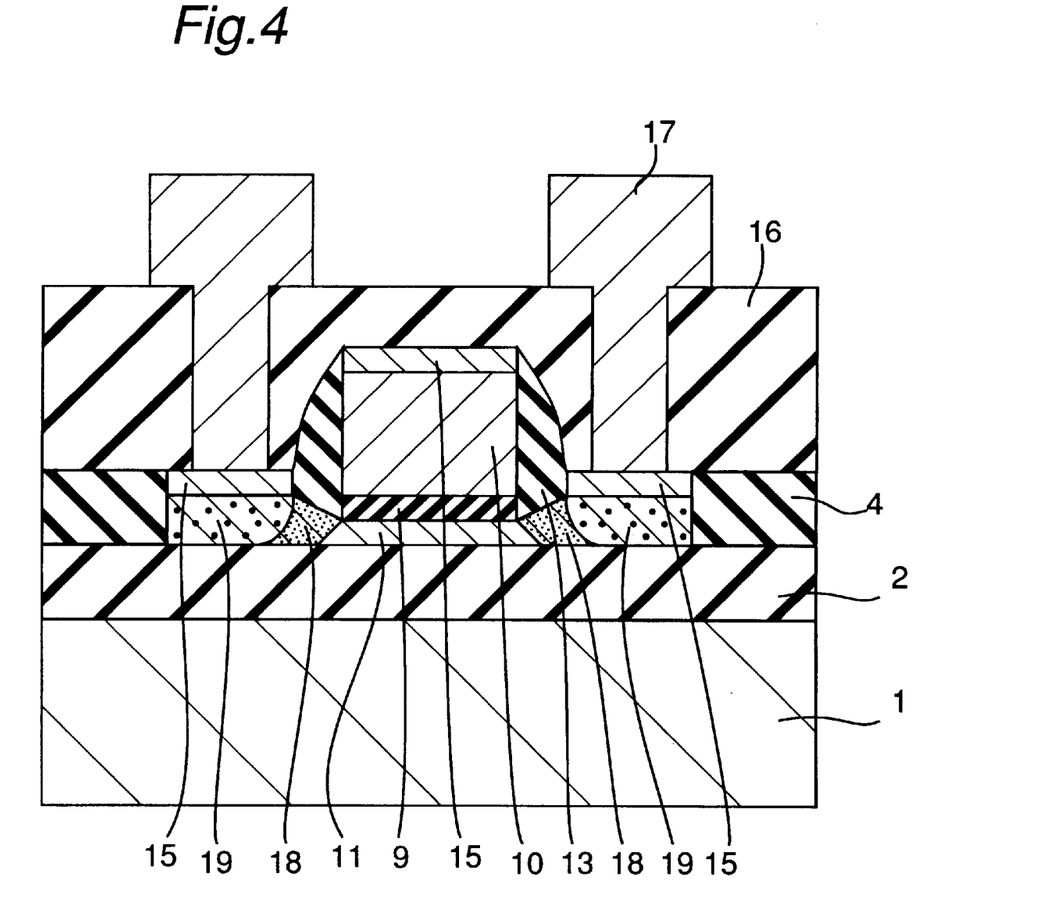
FIG. 4 is a cross-sectional view of a structure of the field-effect transistor fabricated through the steps shown in FIGS. 3A through 3H.

Then, the oxide film remaining on the surface of the source/drain regions and the surface of the gate electrode is removed by hydrofluoric acid. Subsequently, a Ti film 14 is formed to a thickness of 60 nm by sputtering. (FIG. 3G) Next, the Ti film 14 is subjected to a heat treatment at a temperature of 600° C. for 10 seconds to form a silicide film 15 of a high-resistance phase of C49 on the gate electrode 10 and the high-concentration source/drain regions 19. Next, the unreacted Ti film 14 is removed by sulfuric acid and hydrogen peroxide solution, and the silicide film 15 is further subjected to a heat treatment at a temperature of 800° C. for 60 seconds, whereby a low-resistance phase of C54 is obtained. After the above process, a structure having a cross section shown in FIG. 3G is obtained. Subsequently, similar to the step shown in FIG. 1H of the first embodiment, an interlayer insulating film 16 comprised of CVD oxide is formed to a thickness of 800 nm, and then flattened by the CMP process. Then, through a typical contact process and wiring process, a field-effect transistor as shown in FIG. 4 is obtained.

As obvious from the above, in forming a transistor of the recessed structure in which the SOI layer thickness of the channel region and that of the source/drain region are independently controllable, the present invention enables the gate electrode and the channel region to be defined by self-alignment without making the gate electrode overlap the LOCOS ends. In addition, the present invention enables the salicide technique to be applied. Therefore, the present invention realizes formation of a highly reliable transistor in which the complete depletion operation is compatible with the reduction in the parasitic resistance of the source/drain regions and also a stable operation is ensured.

Furthermore, according to the present invention, in using the salicide technique, the SOI layer thickness in the source/drain regions is allowed to be controlled. This enables formation of a highly reliable transistor which has a low-resistance phase C54 of, for example, titanium silicide and offers the above operation.

Furthermore, according to the present invention, by performing the LOCOS oxide formation and LOCOS oxide removal process in several stages, in other words, by repeating the step of forming the LOCOS oxide and the step of removing the LOCOS oxide a plurality of times, the influence of a stress exerted by the restraining film upon the LOCOS ends is reduced. Therefore, the flat portion of the gate electrode forming region can be made wide, and the stress toward the inside of the SOI layer at the LOCOS ends can be reduced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of fabricating a field-effect transistor, comprising:

forming a LOCOS oxide restraining film on an SOI layer which is formed on a substrate of a wafer with interposition of a first insulating film between said substrate and said SOI layer;

forming an opening in said restraining film in a region corresponding to a channel region;

thermally oxidizing said SOI layer using said restraining film having the opening as a mask to form a LOCOS oxide film, and then removing said LOCOS oxide film to thereby provide the SOI layer with a recess defining the channel region;

depositing a second insulating film on an entire surface of the wafer and then anisotropically etching said second insulating film to thereby form first side walls on side surfaces defining said opening of said restraining film;

exposing a top surface of said SOI layer inside said opening to form a gate insulating film on that top surface, and then forming a polycrystalline silicon film serving as a gate electrode inside said opening, wherein a top surface of said polycrystalline silicon film is at a level not higher than that of a top surface of said restraining film; and removing said restraining film and said first side walls, and then, implanting ions into said SOI layer using said gate electrode as a mask to thereby form a source region and a drain region.

2. The method as claimed in claim 1, further comprising:

depositing a third insulating film on an entire surface of the wafer, and anisotropically etching said third insulating film to form second side walls on side surfaces of said gate electrode; and forming a high-melting-point metal on an entire surface of the wafer, and thermally treating said high-melting-point metal so as to form a high-melting-point metal silicide film on said gate electrode and said source and drain regions.

3. The method as claimed in claim 1, wherein the thermal oxidization of said SOI layer to form the LOCOS oxide film and removal of said LOCOS oxide film is performed in a plurality of stages.

4. The method as claimed in claim 1, wherein said LOCOS oxidation restraining film consists of a silicon oxide film and a silicon nitride film which are formed in that order.

5. The method as claimed in claim 1, wherein said exposed top surface of said SOI layer on which said gate insulating film is formed is a flat surface.

6. A method of fabricating a field-effect transistor, comprising:

forming a LOCOS oxide restraining film on an SOI layer which is formed on a substrate of a wafer with interposition of a first insulating film between said substrate and said SOI layer;

forming an opening in said restraining film in a region corresponding to a channel region;

thermally oxidizing said SOI layer using said restraining film having the opening as a mask to form a LOCOS oxide film, and then removing said LOCOS oxide film to thereby provide the SOI layer with a recess defining the channel region;

depositing a second insulating film on an entire surface of the wafer and then anisotropically etching said second insulating film to thereby form first side walls on side surfaces defining said opening of said restraining film;

exposing a top surface of said SOI layer inside said opening to form a gate insulating film on that top surface, and then forming a polycrystalline silicon film serving as a gate electrode inside said opening, wherein a top surface of said polycrystalline silicon film is at a level not higher than that of a top surface of said restraining film;

removing said restraining film and said first side walls, and then, implanting ions into said SOI layer using said gate electrode as a mask to thereby form a low-concentration source region and a low-concentration drain region;

depositing a third insulating film on an entire surface of the wafer, and anisotropically etching said third insulating film to form second side walls on side surfaces of said gate electrode; and implanting ions into said SOI layer using said gate electrode and said second side walls as a mask to thereby form a high-concentration source region and a high-concentration drain region.

7. The method as claimed in claim 6, further comprising:

forming a high-melting-point metal on an entire surface of the wafer, and thermally treating said high-melting-point metal so as to form a high-melting-point metal silicide film on said gate electrode and said high-concentration source and drain regions.

8. The method as claimed in claim 6, wherein the thermal oxidization of said SOI layer to form the LOCOS oxide film and removal of said LOCOS oxide film is performed in a plurality of stages.

9. The method as claimed in claim 6, wherein said LOCOS oxidation restraining film consists of a silicon oxide film and a silicon nitride film which are formed in that order.

10. The method as claimed in claim 6, wherein said exposed top surface of said SOI layer on which said gate insulating film is formed is a flat surface.

* * * * *